(12) United States Patent
Chida

(10) Patent No.: US 7,368,982 B2
(45) Date of Patent: May 6, 2008

(54) BALANCED OUTPUT CIRCUIT AND ELECTRONIC APPARATUS UTILIZING THE SAME

(75) Inventor: Taisuke Chida, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 95 days.

(21) Appl. No.: 10/597,908

(22) PCT Filed: Aug. 24, 2005

(86) PCT No.: PCT/JP2005/015822

§ 371 (c)(1),
(2), (4) Date: Aug. 11, 2006

(87) PCT Pub. No.: WO2006/025417

PCT Pub. Date: Mar. 9, 2006

(65) Prior Publication Data

US 2007/0257734 A1    Nov. 8, 2007

(30) Foreign Application Priority Data

Sep. 3, 2004    (JP) .............................. 2004-257702

(51) Int. Cl.
*H03F 1/02*    (2006.01)
(52) U.S. Cl. .................... 330/9; 330/260; 330/301; 330/85
(58) Field of Classification Search ............... 330/9, 330/260, 301, 85, 97
See application file for complete search history.

(56) References Cited

U.S. PATENT DOCUMENTS

| 4,509,019 | A |   | 4/1985  | Banu et al. |
| 5,508,656 | A | * | 4/1996  | Jaffard et al. ............ 330/9 |
| 5,926,066 | A | * | 7/1999  | Sauer ...................... 330/9 |
| 6,011,435 | A | * | 1/2000  | Takeyabu et al. ......... 330/252 |
| 6,933,762 | B2| * | 8/2005  | Ono ........................ 327/307 |
| 7,078,965 | B2| * | 7/2006  | Laletin .................... 330/48 |
| 7,142,047 | B2| * | 11/2006 | Sahandiesfanjani et al. ... 330/9 |

FOREIGN PATENT DOCUMENTS

| JP | 60-500395 A | 3/1985 |
| JP | 10-093365 A | 4/1998 |
| JP | 2000-004129 A | 1/2000 |
| JP | 2000-252770 A | 9/2000 |
| JP | 2001-326545 A | 11/2001 |

OTHER PUBLICATIONS

Official communication issued in the corresponding International Application No. PCT/JP2005/015822, mailed on Dec. 6, 2005.

* cited by examiner

*Primary Examiner*—Patricia Nguyen
(74) *Attorney, Agent, or Firm*—Keating & Bennett, LLP

(57) ABSTRACT

In a balanced output circuit, an input signal inputted thereto is provided as a first output signal thereof on one hand, and on the other hand the input signal is inputted to an inverting amplification circuit and is compared with a comparison voltage before the signal is outputted as a second output signal. Based on the comparison of the first and second output signals, the comparison voltage is controlled by a charging voltage of a capacitor such that the DC voltage of the second output signal is equalized to that of the first output signal. Thus, the DC offset voltage between the first output signal (non-inverted output signal) and the second output signal (inverted output signal) can be properly annihilated by a simple circuit.

12 Claims, 5 Drawing Sheets

BALANCED OUTPUT CIRCUIT AND ELECTRONIC APPARATUS UTILIZING THE SAME

BACKGROUND OF THE INVENTION

1. Field of the Invention

This invention relates to balanced output circuit for outputting balanced inverted and non-inverted outputs, and to an electronic apparatus, such as a portable telephone, utilizing such balanced output circuit.

2. Description of the Related Art

In a baseband signal transmission output part and a BTL (Balanced Transformer-less) speaker driver of a portable telephone for example, a balanced output circuit is used which is adapted to provide a non-inverted output that is in phase with an input signal and an inverted output that is out of phase by 180 degrees with the input signal.

In a conventional electric power amplification circuit for use with audio equipment, an audio signal transmitted from a prestage circuit via a capacitor and an inverted feedback signal are inputted to a BTL amplifier. The BTL amplifier provides at the two BTL output terminals thereof an amplified audio signal and an amplified differential signal that is obtained by adding a reference voltage to the difference between the audio signal and the inverted feedback signal. The two output signals are provided to a speaker. The voltage difference between the two amplified signals outputted from the respective BTL output terminals is detected by a differential amplification circuit. The DC component (DC voltage) of the amplified differential signal is extracted by a mirror integration circuit. An inverted feedback signal that is inversely proportional to the DC voltage offset from the reference voltage is fed back to the BTL amplifier. This scheme enables suppression of the DC offset voltage generated across the BTL output terminals of a BTL amplifier. (See, for example, Japanese Patent Application Laid Open, No. H10-93365, which will be referred to as Patent Document 1.)

Such a prior art output circuit as mentioned above requires not only a coupling capacitor for inputting an audio signal received from its prestage circuit, but also a BTL amplifier for providing an inverted and a non-inverted outputs. The output circuit further requires a differential amplification circuit and an error integration circuit for suppressing the DC offset voltage generated in the BTL amplifier. As a consequence, although the output circuit can control the DC offset voltage, the circuit has a complex structure, which results in a consequent problem of increased manufacturing cost of an IC that incorporates the BTL amplifier.

It is, therefore, an object of the present invention to provide a balanced output circuit for generating both an inverted and a non-inverted output signals in response to an input signal such as an audio signal, the circuit having a simple circuit structure, yet capable of properly annihilating the DC offset voltage that otherwise exists between the two output signals. It is another object of the invention to provide an electronic apparatus such as a portable telephone equipped with an inventive balanced output circuit and a prestage circuit.

SUMMARY OF THE INVENTION

A balanced output circuit of the invention for outputting a first output signal Voutp in accordance with an input signal Vin received from a prestage circuit 30 and a second output signal Voutn that is an inverted version of the first output signal Voutp, comprises: a comparison voltage generation circuit that includes a capacitor 14 to generate a comparison voltage Vcom in accordance with the charging voltage of the capacitor;

an inverting amplification circuit adapted to receive a voltage associated with the input signal and the comparison voltage, invert and amplify the voltage associated with the input signal, and output the amplified voltage as the second output signal; and a charging circuit for charging the capacitor in response to the first and second output signals so that the DC voltage of the second output signal becomes equal to the DC voltage of the first output signal.

The charging circuit may have a control amplifier for controlling the comparison voltage based on the comparison of the first and second output signals so as to make the DC voltage of the second output signal equal to the DC voltage of the first output signal.

In the balanced output circuit, the above-described comparison voltage Vcom may be the voltage obtained by superposing the charging voltage of the capacitor on a reference voltage Vref, and the input signal may be the signal obtained by superposing a DC offset voltage on the reference voltage.

The control amplification circuit may be operated only for a predetermined period T1 for determining the comparison voltage Vcom.

The control amplification circuit may have an amplifier 15 receiving the first and second output signals and output supplying switch means 18 for supplying the amplified output of the amplifier 15 to the capacitor 14. The control amplification circuit may have further discharging switch means 19 for discharging the capacitor prior to determining the comparison voltage.

The balanced output circuit may be adapted to discharge the capacitor by the discharging switch means at predetermined regular time intervals or within a predetermined period, and then re-determine the comparison voltage.

The balanced output circuit may further comprise an input amplification circuit 20 for amplifying the input signal to generate the first output signal.

An electronic apparatus in accordance with the present invention may comprise:

a prestage circuit 30 for processing a signal and for outputting a synthesized signal obtained through synthesis of a signal component and a DC voltage that is obtained by superposing an offset voltage Vofs on a reference voltage Vref;

a balanced output circuit 10, adapted to receive the output signal Vin of the prestage circuit; and a load circuit 50 driven by the balanced output circuit.

The invention can generate balanced outputs by controlling the comparison voltage of an inverting amplification circuit using a control amplification circuit so as to annihilate the DC offset voltage that exists between the inverted and non-inverted output signals of the inverting amplification circuit.

It should be noted that the comparison voltage is determined by the charging voltage of the equivalent capacitor that incorporates the actual capacitor as well as the stray capacitor and parasitic capacitor of the inverting amplification circuit, and that the offset voltage can be properly annihilated. It should be also noted that since the capacitance of the capacitor can be reduced for the reason as stated above, the cost of an IC (LSI) incorporating the balanced output circuit could be reduced accordingly.

The control amplification circuit needs be operated only for a short period T1 to determine the comparison voltage Vcom, which requires only a small capacitance for the capacitor.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

An inventive balanced output circuit and an electronic apparatus such as a portable telephone utilizing the balanced output circuit will now be described in detail by way of example with reference to the accompanying drawings. It would be understood that the balanced output circuit and a prestage circuit therefor are fabricated in an LSI, so that the entirety of the circuits can be thought of as a semiconductor device.

Figure 1:
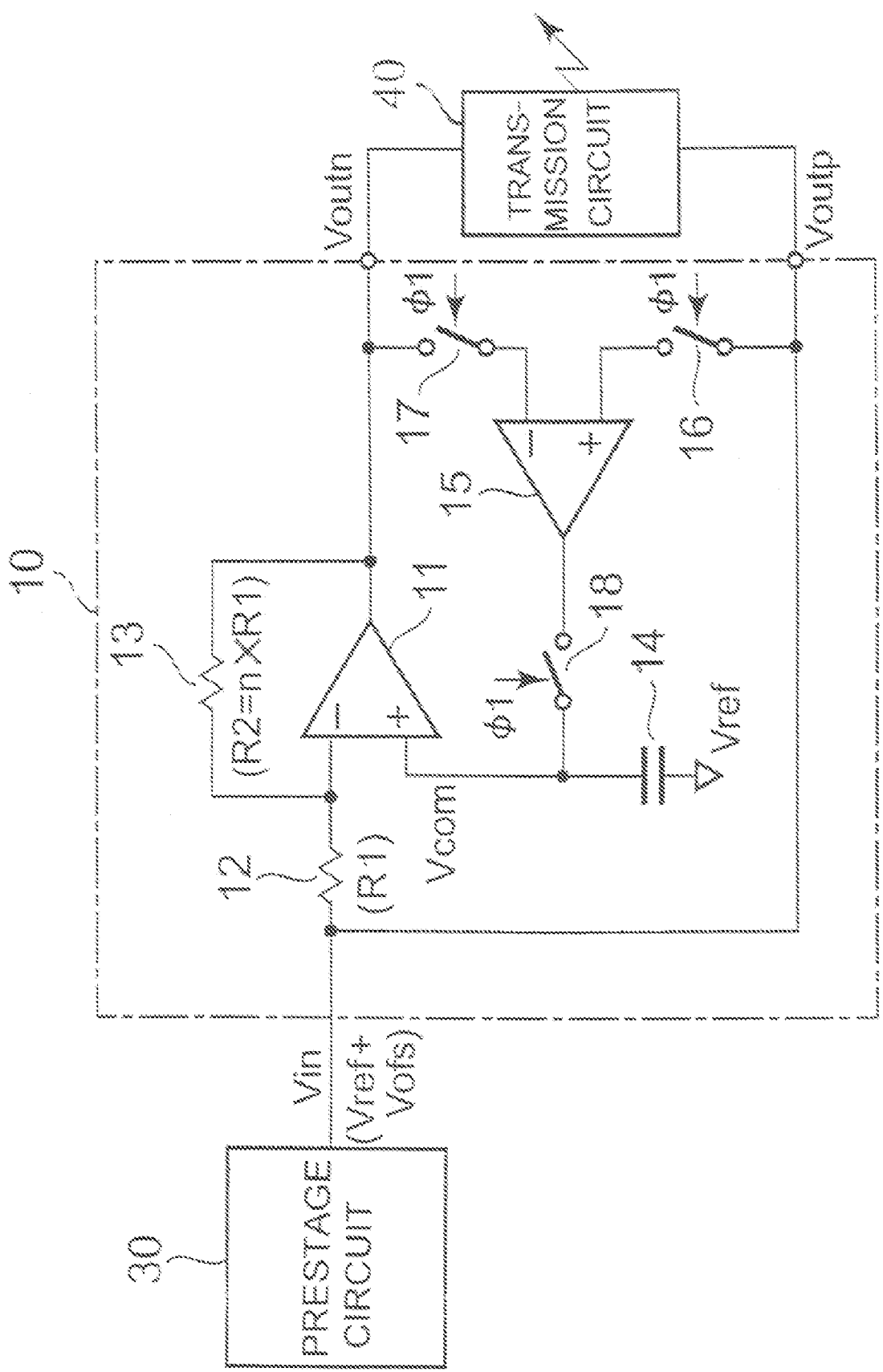
FIG. 1 is a diagram showing the circuit arrangement of a balanced output circuit in accordance with a first embodiment of the invention, along with the arrangement of an electronic apparatus utilizing the balanced output circuit.

Referring to FIG. 1, there is shown an arrangement of a balanced output circuit 10 in accordance with a first embodiment of the invention and an electronic apparatus such as a portable telephone utilizing the balanced output circuit. The balanced output circuit can be used in a balanced output part of an electric/electronic apparatus, such as a base-band signal transmitter of a portable telephone and a BTL speaker driver, adapted to output an inverted output signal in balance with a non-inverted output signal.

A prestage circuit 30 shown in FIG. 1 is adapted to process an AC audio signal, and outputs the AC (audio) signal superposed on a DC reference voltage Vref. It is often the case that the reference voltage Vref is superposed with a DC offset voltage Vofs resulting from variations in the characteristic properties of various circuit elements of the prestage circuit. That is, the output of the prestage circuit has a DC voltage, which amounts to the reference voltage Vref superposed with the DC offset voltage Vofs. The resultant DC voltage or the resultant DC voltage superposed with the AC signal is fed as an input signal Vin to the balanced output circuit 10 in the next stage.

In the present invention, the balanced output circuit 10 is supplied with the input signal Vin directly from the prestage circuit 30 without intervening any coupling capacitor. The balanced output circuit 10 directly outputs the input signal Vin as a first output signal Voutp, and at the same time outputs, through an inverting amplification circuit, a second output Voutn that is an inverted version of the first output signal Voutp.

Thus, the balanced output circuit 10 does not require a coupling capacitor, and needs to generate only the second output signal Voutn. Hence, the circuit is basically simple in configuration. Of course, in order for the circuit 10 to function as a balanced output circuit, it is configured to generate balanced outputs by annihilating the DC offset voltage between the non-inverted first output signal Voutp and the inverted second output signal Voutn.

The inverting amplification circuit includes an operational amplifier 11 utilizing a differential amplifier having a non-inverting (+) input terminal and an inverting (−) input terminal, an input resistor 12 connected to the inverting (−) input terminal, and a feedback resistor 13 connected between the inverting (−) input terminal and the output terminal thereof. Of course, further circuits including a feedback circuit for feeding back AC components of the signal may be provided. For simplicity of description, however, they are omitted. In the example shown herein, the resistance of the input resistor 12 is R1, and the resistance of the feedback resistor 13 is R2 (=n×R1), where n is a factor of arbitrary magnitude. When n is set to 1, the AC component of the second output signal Voutn can be equalized in magnitude to the AC component of the first output signal Voutp.

The operational amplifier 11 is fed at the non-inverting (+) input terminal thereof with a comparison voltage Vcom that is obtained by superposing the charging voltage Vc of a capacitor 14 charged to the voltage (to annihilate the offset voltage) on the reference voltage Vref. A comparison voltage generation circuit is configured to include this capacitor 14.

In the example shown herein, the reference voltage Vref of the operational amplifier 11 and the reference voltage Vref of the prestage circuit 30 are the same, which is one half the power supply voltage Vdd for the balanced output circuit 10. That is, Vref=Vdd×1/2. It is noted that when the power supply voltage is provided by a pair of positive and negative power supply voltages, the reference voltage may be taken to be the mean voltage of the pair, i.e. the ground potential.

A control amplification circuit includes: an operational amplifier 15 in the form of a differential amplifier having two input terminals; a first switch 16 connected between a terminal providing the first output signal Voutp and the non-inverting (+) input terminal of the operational amplifier 16; a second switch 17 connected between a terminal providing the second output signal Voutn and the inverting (−) input terminal of the operational amplifier 16; and a third switch 18 connected between the output terminal of the operational amplifier 15 and a node having the comparison voltage Vcom supplied from the capacitor 14.

Each of the first through third switches 16-18 is preferably a transistor such as a MOS transistor that can be controllably turned on and off by an offset annihilation signal 1. In the example shown herein, the first through third switches 16-18 are turned on by the offset annihilation signal 1 having HIGH (H) level.

A transmission circuit 40 is a component of a base-band signal output part for use in, for example, a portable telephone, driven by the balanced first and second outputs signals Voutp and Voutn, respectively. The transmission circuit can be replaced by a component requiring balanced outputs power, such as a BTL speaker driven by a BTL speaker driver.

When the input signal Vin supplied from the prestage circuit 30 to the balanced output circuit 10 has no DC offset voltage Vofs, so that the reference voltage Vref solely is inputted to the balanced output circuit 10, the DC voltage of the first output signal Voutp equals the reference voltage Vref. On the other hand, if the charging voltage Vc of the capacitor 14 is initially zero, the comparison voltage Vcom equals the reference voltage Vref. Thus, the voltage at the output terminal of the operational amplifier 11, i.e. the DC voltage of the second output signal Voutn, also equals the reference voltage Vref.

In this case, if the operational amplifier 15 of the control amplification circuit is operated, the above-described condition will not change. As a consequence, the DC offset voltage between the inverted second output signal Voutn and the non-inverted first output signal Voutp is zero, thereby generating balanced output signals.

We now consider a case where the DC voltage of the input signal Vin inputted to the balanced output circuit 10 from the prestage circuit 30 has a DC offset voltage Vofs, which is superposed on the reference voltage Vref and inputted to the balanced output circuit 10. In this case, offset annihilation operation is performed in accordance with the invention. The offset annihilation operation will be described with reference to FIG. 2.

As the reference voltage Vref, superposed with the DC offset voltage Vofs, is inputted to the balanced output circuit 10, the DC voltage of the inputted signal is outputted therefrom as the first output signal Voutp.

Figure 2:
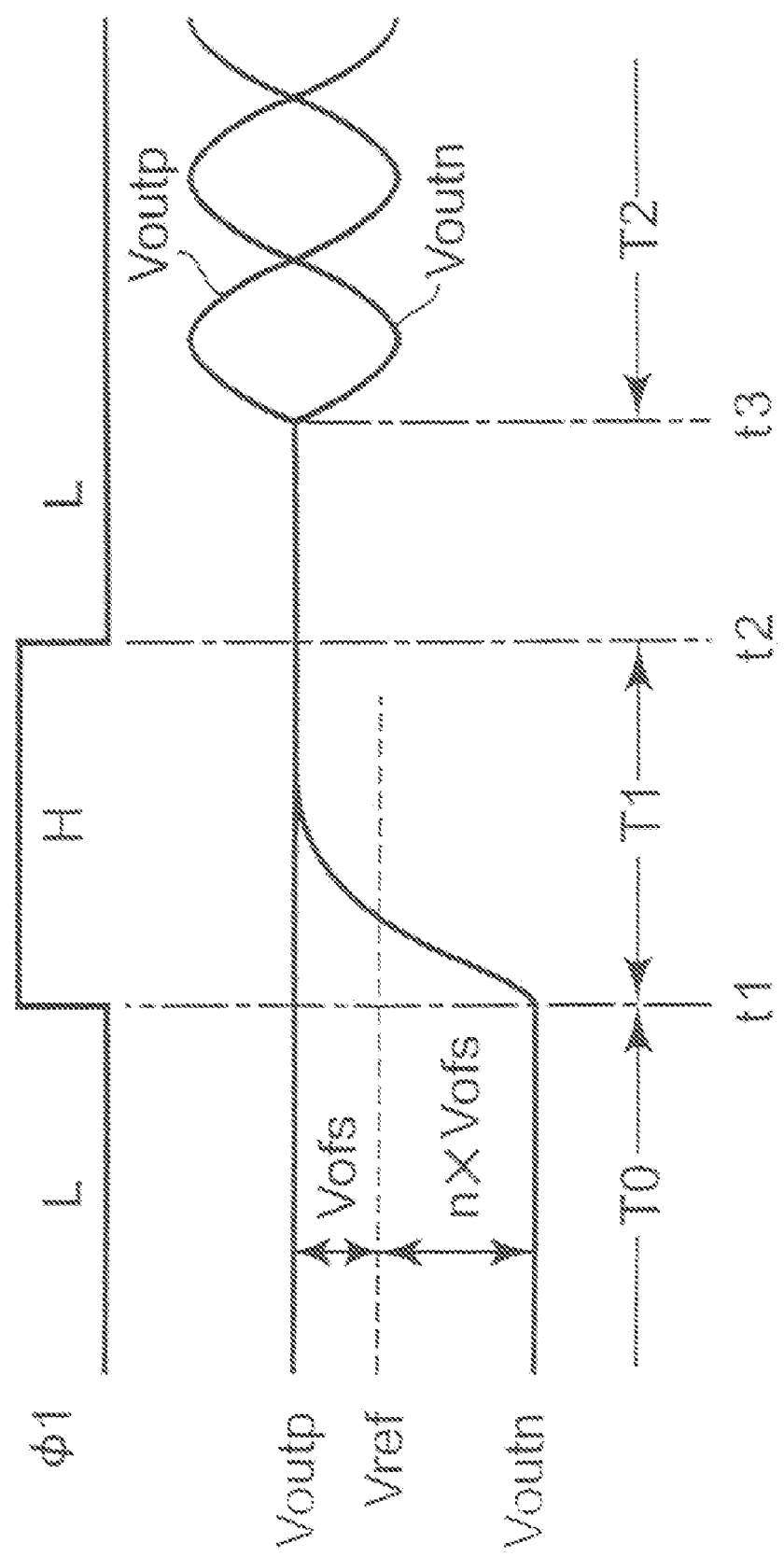
FIG. 2 is a diagram illustrating offset annihilation operation in accordance with the invention.

It is seen in FIG. 2 that for a period T0 up to time t1 the offset annihilation signal has LOW (L) level, which causes the first through third switches 16-18 to be turned off. Under this condition, the comparison voltage Vcom is equal to the reference voltage Vref, and, due to the fact that the input signal Vin is fed back and amplified in the operational amplifier 11, the second output signal Voutn becomes lower than the reference voltage Vref by a voltage of n times the DC offset voltage Vofs, that is, Voutn=Vref−n×Vofs.

As the offset annihilation signal is pulled up to H level at time t1, the first through third switches 16-18 are turned on to charge the capacitor 14 by the output of the operational amplifier 15. The comparison voltage Vcom that results from the superposition of the charging voltage of the capacitor 14 on the reference voltage Vref varies until it becomes equal to the inputted DC voltage (Vref+Vofs). As the comparison voltage Vcom becomes equal to the inputted DC voltage, so does the second output signal Voutn to the first output signal Voutp. That is, the DC offset voltage that exists between the first output signal Voutp and the second output signal Voutn can be annihilated to generate balanced outputs by controlling the comparison voltage Vcom of the inverting amplification circuit by the control amplification circuit.

At the end of period T1 of the offset annihilation operation, i.e. at time t2, the offset annihilation signal is pulled down to L level to stop the operation of the control amplification circuit.

Under the condition with the control amplification circuit being stopped, the switches 16-18 are turned off, so that, except through slight natural discharge of electricity, the capacitor 14 will not discharge and maintain its state. Thus, the capacitor 14 can be of small capacitance. Parasitic capacitors and floating capacitors naturally exist in the operational amplifier 11 and its adjacent circuits, but they are altogether charged to the same voltage as the capacitor 14. Therefore, those parasitic capacitors and floating capacitors will give rise to no error in the offset annihilation operation.

At time t3 when the offset annihilation operation is finished, the input signal Vin, which is obtained by superposing an audio signal on a DC voltage, is inputted. In period T2 beginning at time t3, audio signals in the form of the first and second output signals Voutp and Voutn, respectively, are generated in opposite phase, so that the transmission circuit 40 is driven by the differential signal voltage generated by the BTL circuit.

In this way, the DC offset voltage that exists between the first and second output signals Voutp and Voutn, respectively, is annihilated under the condition that no AC audio signal is applied to the transmission circuit. Thus, the control amplification circuit needs only be operated to determine the comparison voltage Vcom in a short period of time T1, so that, in addition to reduction of the capacitor as stated above, the capacitance of the capacitor can be further reduced.

It is noted that the first and second switches 16 and 17, respectively, can be omitted by directly inputting the first and second output signals Voutp and Voutn, respectively, to the operational amplifier 15.

Although the operation has been described above for the case of a positive DC offset voltage Vofs, the operation will be essentially the same if the DC offset voltage Vofs is negatively polarized.

Figure 3:
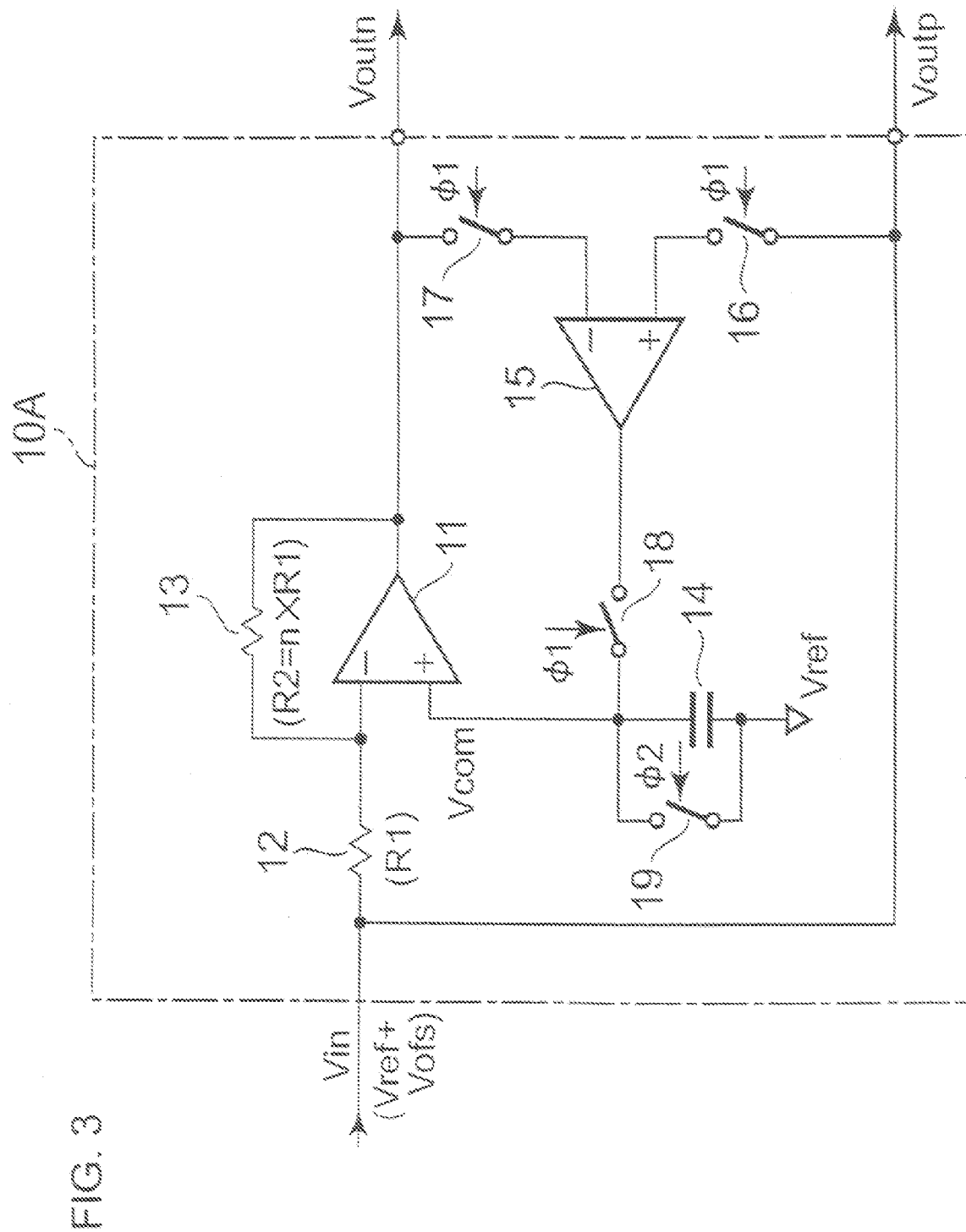
FIG. 3 is a diagram showing the circuit arrangement of a balanced output circuit 10A in accordance with a second embodiment of the invention.

Referring to FIG. 3, there is shown an arrangement of a balanced output circuit 10A in accordance with a second embodiment of the invention. In the example shown in FIG. 3, a switch 19 for discharging the capacitor 14 is connected in parallel to the capacitor 14 (the switch referred to as discharging switch). The discharging switch 19 is a MOS transistor that can be turned on and off by a discharge signal 2.

It should be noted that the charged capacitor 14 undergoes natural discharge to loose its electricity. In the meanwhile, therefore, the capacitor may cause an error in the offset annihilation operation.

In order to prevent such condition from occurring, it is preferable to repeat offset annihilation operation periodically with a certain period of time or within a predetermined time. To do so, the switch 19 may be turned on by a discharge signal 2 only for a short time to temporally discharge the capacitor 14 prior to a further offset annihilation operation, in the manner as described in connection with FIGS. 1 and 2.

Particularly, in the cases where the balanced output circuits 10 and 10A of the invention are used in, for example, a modulated wave transmission circuit that operates in TDMA (Time-Division-Multiplexing Access) mode, it is preferable to perform offset annihilation operation once every burst transmission that lasts a few milliseconds. In this case, it is only necessary to maintain the offset annihilation voltage at a required level for at least the burst transmission period.

Therefore, the capacitance of the capacitor 14 can be made extremely small. It should be noted that the offset voltage might be annihilated by discharging or resetting the capacitor 14 by the switch means 19 prior to a burst transmission, and then performing the offset voltage annihilation operation.

Figure 4:
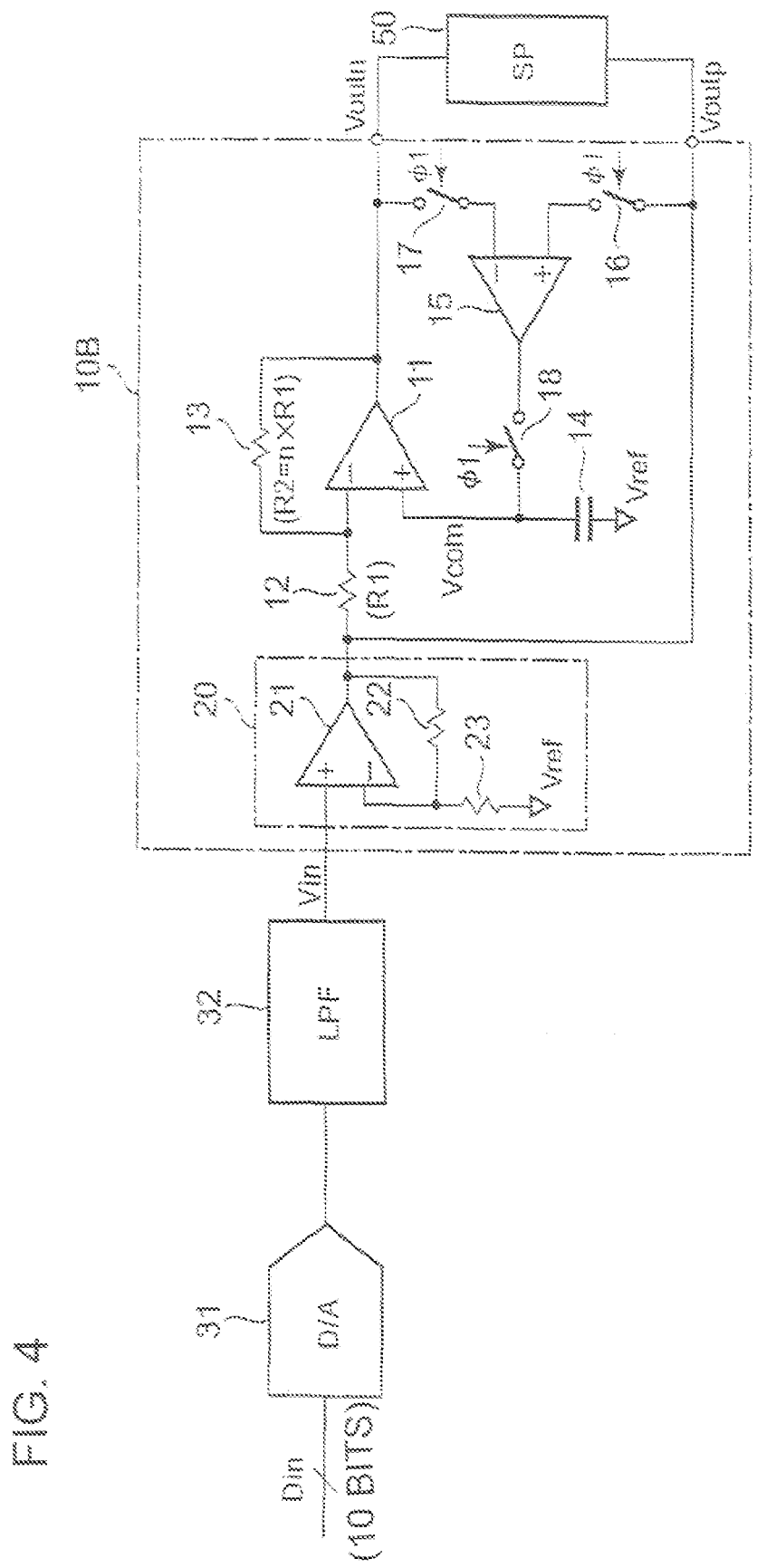
FIG. 4 is a diagram showing the arrangement of an electronic apparatus in accordance with the invention.

Referring to FIG. 4, there is shown an arrangement of an electronic apparatus such as a portable telephone in accordance with the present invention.

FIG. 4 shows an example of a balanced output circuit 10B that has an input amplification circuit 20. The input amplification circuit 20 has a differential amplifier such as an operational amplifier 21, which receives at the non-inverting (+) input terminal thereof an input signal Vin. The output voltage appearing at the output terminal of the input amplification circuit 20 is divided by a voltage dividing circuit consisting of resistors 22 and 23, and the divided voltage is inputted to the inverting (−) input terminal of the operational amplifier 21. Another end of the voltage dividing resistor 23 is coupled to a reference voltage Vref. In this way, the input signal Vin is amplified before it is outputted from the input amplification circuit 20.

Thus, if the level of the input signal Vin is lower than a desired level, it can be amplified to obtain balanced output signals Voutp and Voutn having a predetermined level. In this case also, the DC offset voltage Vofs between the first and second output signals Voutp and Voutn, respectively, is annihilated, in the same manner as shown in FIG. 1.

In the example shown in FIG. 4, the electronic apparatus is fed with a digital signal Din (of 10 bits for example) such as an audio signal. The digital signal Din is converted into an analog signal by a digital-to-analog (D/A) converter 31. The analog signal is then filtered with a low-pass filter (LPF) 32 having Bata Wace characteristic. This Bata Worth type LPF 32 utilizes an operational amplifier, resistors, and capacitors, and operates based on the reference voltage Vref. An LPF having a fourth order Bata Wace characteristic is suitable for use with the present electronic apparatus.

The input signal Vin supplied from this LPF 32 results from synthesis of an audio signal and a DC voltage. The DC voltage is the reference voltage Vref, which is superposed with the DC offset voltage Vofs. The second output signal Voutn is inverted and amplified in accordance with the DC offset voltage Vofs so as to annihilate the DC offset voltage that exists between the first output signal Voutp and the second output signal Voutn, thereby providing balanced outputs to a speaker 50.

It should be understood that the input amplification circuit 20 might be provided outside the balanced output circuit 10B. In this case, the D/A converter 31, LPF 32, and input amplification circuit 20 constitute a prestage circuit 30.

The speaker 50 may be replaced by a transmission circuit 40 as shown in FIG. 1. In that case also, a simplified balanced output circuit for use with an electronic apparatus such as a portable telephone can be implemented while ensuring annihilation of the DC offset voltage between the first and second output signals Voutp and Voutn, respectively.

Figure 5:
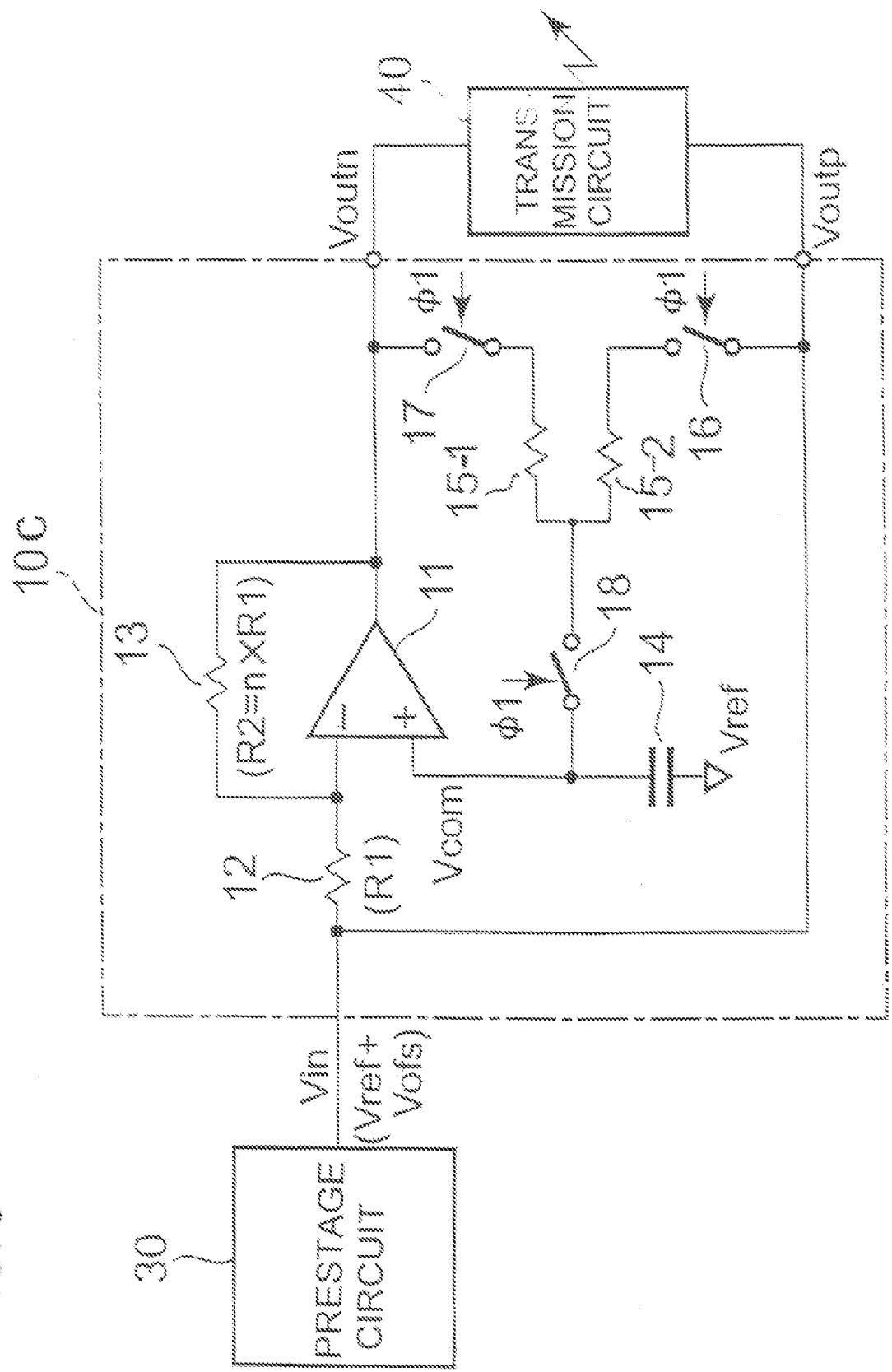
FIG. 5 is a diagram showing the arrangement of a balanced output circuit in accordance with a further embodiment of the invention.

Referring to FIG. 5, there is shown an arrangement of another balanced output circuit 10C in accordance with the invention. As seen in FIG. 5, the operational amplifier 15 of FIG. 1 is replaced by a resistive voltage dividing circuit for generating the mean voltage between the first and second output signals Voutp and Voutn, respectively. This resistive voltage dividing circuit is a series circuit of resistors 15-1 and 15-2, with the node connecting them further connected to one end of a third switch 18. It is noted that the first and second switches 16 and 17 can be omitted so as to permit the first and second output signals Voutp and Voutn, respectively, to be directly inputted to the respective resistors 15-1 and 15-2. Arrangement and functions of other portions of the balanced output circuit are the same as those shown in FIG. 1. The balanced output circuit shown in FIG. 5 has a simpler structure than the one shown in FIG. 1, but provides the same functions.

The balanced output circuit of the present invention has a simple circuit structure, yet it can generate an inverted and a non-inverted output signals for an input signal such as an audio signal so as to properly annihilate the DC offset voltage that exists between the inverted and non-inverted output signals. In combination with a prestage circuit, the balanced output circuit can be configured suitable for an electronic apparatuses such as a portable telephone.

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. A balanced output circuit for outputting a first output signal in accordance with an input signal received from a prestage circuit and a second output signal that is an inverted version of the first output signal, said balanced output circuit comprising:
   a comparison voltage generation circuit including a capacitor to generate a comparison voltage in accordance with the charging voltage of said capacitor;
   an inverting amplification circuit adapted to receive a voltage associated with said input signal and said comparison voltage, invert and amplify said voltage associated with said input signal, and output the amplified voltage as said second output signal; and
   a charging circuit for charging said capacitor in accordance with said first and second output signals so that the DC voltage of said second output signal becomes equal to the DC voltage of said first output signal.

2. The balanced output circuit in accordance with claim 1, wherein said charging circuit has a control amplification circuit for controlling said comparison voltage based on the comparison of said first and second output signals so as to make the DC voltage of said second output signal equal to the DC voltage of said first output signal.

3. The balanced output circuit in accordance with claim 2, wherein
   said comparison voltage is the voltage obtained by superposing the charging voltage of said capacitor on a reference voltage; and
   said input signal is the signal obtained by superposing a DC offset voltage on said reference voltage.

4. The balanced output circuit in accordance with claim 3, wherein said control amplification circuit has
   an amplifier receiving said first and second output signals; and
   output supplying switch means for supplying the amplified output of said amplifier to said capacitor.

5. The balanced output circuit in accordance with claim 4, further comprising discharging switch means for discharging said capacitor prior to determining said comparison voltage.

6. The balanced output circuit in accordance with claim 5, adapted to discharge said capacitor by said discharging switch means at predetermined regular time intervals or within a predetermined period, and then re-determine said comparison voltage.

7. The balanced output circuit in accordance with claim 3, wherein said control amplification circuit is operated only for a predetermined period for determining said comparison voltage.

8. The balanced output circuit in accordance with claim 7, wherein said control amplification circuit has
   an amplifier receiving said first and second output signals; and
   output supplying switch means for supplying the amplified output of said amplifier to said capacitor.

9. The balanced output circuit in accordance with claim 8, further comprising discharging switch means for discharging the electric discharge stored in said capacitor prior to determining said comparison voltage.

10. The balanced output circuit in accordance with claim 2, wherein said control amplification circuit is operated only for a predetermined period for determining said comparison voltage.

11. The balanced output circuit in accordance with claim 1, further comprising an input amplification circuit for amplifying said input signal to generate said first output signal.

12. An electronic apparatus, comprising:
   a prestage circuit for processing a signal and for outputting a synthesized signal obtained through synthesis of a signal component and a DC voltage that is obtained by superposing an offset voltage on a reference voltage;

a balanced output circuit in accordance with any one of claims 1-11, adapted to receive the output signal of said prestage circuit; and a load circuit driven by said balanced output circuit.

* * * * *